United States Patent [19]

Dutta et al.

[11] Patent Number: 5,459,334
[45] Date of Patent: Oct. 17, 1995

[54] NEGATIVE ABSOLUTE CONDUCTANCE DEVICE AND METHOD

[75] Inventors: Mitra Dutta, Matawan, N.J.; Michael A. Stroscio, Durham, N.C.; Vladimir V. Mitin, Ferndale; Rimvydas Mickevicius, Hamtramck, both of Mich.

[73] Assignee: The United States of America as represented by the Secretary of the Army, Washington, D.C.

[21] Appl. No.: 309,214

[22] Filed: Sep. 20, 1994

Related U.S. Application Data

[63] Continuation of Ser. No. 954,221, Sep. 30, 1992, abandoned.

[51] Int. Cl.$^6$ .......................... H01L 29/205; H01L 31/08
[52] U.S. Cl. ................ 257/26; 257/21; 257/23; 257/25; 257/29; 257/184
[58] Field of Search ................... 257/21, 23, 25, 257/26, 29, 184

[56] References Cited

U.S. PATENT DOCUMENTS

| | | |
|---|---|---|
| 3,571,759 | 3/1971 | Kroemer . |
| 4,645,707 | 2/1987 | Davies et al. . |
| 4,704,622 | 11/1987 | Capasso et al. . |
| 5,016,064 | 5/1991 | Goronkin . |
| 5,130,690 | 7/1992 | Ando et al. . |

OTHER PUBLICATIONS

Andronov et al, "Induced Hot–Hole Millimeter Emission in Germanium in Fields E/H (Cyclotron–Resonance Negative–Effective–Mass Amplifier and Generator)," JETP Letters, vol. 40, No. 6, pp. 989–991, Sep. 1984.

"Quantum Wire Superlattices and Coupled Box Arrays: A Novel Method to Suppress Optical Phonon Scattering in Semiconductors", Sakaki, Japanese Journal of Applied Physics, vol. 28, No. 2, pp. L314–L316, Feb., 1989.

"Optical Anisotropy in a Quantum–Well–Wire Array with Two–Dimensional Quantum Confinement", Tsuchiya et al, Physical Review Letters, vol. 62, No. 4, pp. 466–469, Jan., 1989.

"Electron–Optical–Phonon Interaction In Single and Double Heterostructures," Mori et al, Physical Revie B, vol. 40, No. 9, pp. 6175–6188, Sep., 1989.

Primary Examiner—Jerome Jackson
Attorney, Agent, or Firm—Michael Zelenka; William H. Anderson

[57] ABSTRACT

A quantum wire embedded in another material or a quantum wire which is free standing. Specifically, the quantum wire structure is fabricated such that a quantum well semiconductor material, for example Gallium Arsenide (GaAs), is embedded in a quantum barrier semiconductor material, for example Aluminum Arsenide (AlAs). Preferably, the entire quantum wire structure is engineered to form multiple subbands and is limited to a low dimensional quantum structure. The dimensions of the quantum wire structure are preferably around 150×250 Å. This structure has a negative absolute conductance at a predetermined voltage and temperature. As a result of the resonant behavior of the density of states, the rates of electron scattering in the passive region (acoustic phonon and ionized impurity scattering as well as absorption of optical phonons) decrease dramatically as the electron kinetic energy increases.

15 Claims, 5 Drawing Sheets

NEGATIVE ABSOLUTE CONDUCTANCE DEVICE AND METHOD

GOVERNMENT INTEREST

The invention described herein maybe manufactured, used and/or leased by, or on behalf of, the Government of the United States of America without the payment to us of any royalties thereon. This application is a continuation of application Ser. No. 07/954,221, filed Sep. 30, 1992 now abandoned.

FIELD OF THE INVENTION

This invention relates generally to semiconductor devices for electronic and optoelectronic devices and particularly to low dimensional, semiconductor quantum structures which maybe incorporated in ultrafast, super high frequency oscillators, amplifiers and self-regulating switches.

BACKGROUND OF THE INVENTION

Low dimensional structures having quantum confinement of one to three dimensions, such as quantum wells, quantum wires and quantum boxes, have attracted much attention not only for their potential in uncovering new phenomena in solid-state physics, but also for their potential device applications. The reason for this attention is based on the extremely high electron mobilities of the structures themselves and the high performance of devices, such as lasers and modulators, incorporating these structures. This enhanced electron carrier mobility is further achieved by engineering the sub or mini-bands of the structure so that the longitudinal-optical (LO), or surface-optical (SO) phonon transitions are nullified. Examples of such structures are described in articles, such as, "Quantum wire Superlattices and Coupled Box Arrays: A Novel Method to Suppress Optical Phonon Scattering in Semiconductors," Sakaki, *Japanese Journal of Applied Physics*, Vol. 28, No. 2, Pages L314–L316, February, 1989; "Optical Anisotropy in a Quantum-Well-Wire Array with Two-Dimensional Quantum Confinement," Tsuchiya et al, *Physical Review Letters*, Vol. 62, Number 4, pages 466–469, January, 1989; and "Electron-Optical-Phonon Interaction In Single and Double Heterostructures," Mori et al, *Physical Review B*, Volume 40, Number 9, pages 6175–6188, September, 1989.

As was predicted in Sakaki and demonstrated by Ismail et al at the 1988 International Symposium on GaAs and Related Compounds, Atlanta, Ga., September, 1988, breaks in the density of states of quantum structures lead to negative differential conductance and negative transconductance in field effect transistor (FET) configurations. Examples of such devices are described in U.S. Pat. No. 4,704,622, entitled, "Negative Transconductance Device", and issued to Capasso et al on Nov. 3, 1987 and in U.S. Pat. No. 4,645,707, entitled, "Semiconductor Devices", and issued to Davies et al on Feb. 24, 1987, both of which are incorporated herein by reference hereto. The Capasso et al device is a three-terminal resonant-tunneling structure based on resonant tunneling of a two-dimensional electron gas which is gated into a one-dimensional quantum wire to produce a negative transconductance. Quantum wire arrays have also been considered as potential low-current-threshold semiconductor lasers as reported in Tsuchiya et al. The devices described thus far, however, only provide a minimal variation of conductance, even though far greater variations have been predicted by authors such as H. Krömer in *Physical Review* 109, page 1856 (1958). Therefore, in addition to the relatively commonly described negative differential conductivity in semiconductors, a more pronounced reversal of a current relative to an electrical field is also realizable. This more pronounced effect, termed negative absolute conductance, was first predicted by H. Krömer. Since 1958, this effect has been further developed and observed experimentally by G. C. Dousmanis, *Physical Review Letters* 1, Vol. 55 (1958) and by E. M. Gershenzon et al, *Ukr. Fiz. Zh* 9, page 948 (1964). If negative absolute conductance was obtainable in low dimensional quantum structures, then the performance of semiconductor devices utilizing such structures would be greatly enhanced. The present invention addresses such a device.

SUMMARY OF THE INVENTION

Accordingly, it is an objective of the present invention to provide a device which produces picosecond control of electrical functions in ultrafast semiconductor devices.

Another objective of the present invention is to provide for a device that produces such control by utilizing negative absolute conductance of a quantum wire structure.

These and other objects of the present invention are accomplished by fabricating a quantum wire which is either embedded in another material or is free standing. Specifically, the quantum wire structure may be fabricated such that a quantum well semiconductor material, for example Gallium Arsenide (GaAs), forms a quantum wire structure embedded in a quantum barrier semiconductor material, for example Aluminum Arsenide (AlAs). Preferably, the entire quantum wire structure forms multiple subbands and is limited to a one dimensional quantum structure. The dimensions of the quantum wire structure are preferably around 150×250 Å or less. This structure has a negative absolute conductance at a predetermined voltage and temperature. Quantum wires have two primary advantages for realization of negative absolute conductance over bulk materials because: 1) electrons in such a structure have no transverse components of velocity, thus these structures provide a unique carrier scattering and 2) the longitudinal-optical (LO) phonon emission rate is very high in the active region threshold so that electrons are prevented from penetrating deeply into the active region above the optical phonon energy. As a result of the resonant behavior of the density of states, the rates of electron scattering in the passive region below the optical phonon energy decrease dramatically as the electron kinetic energy increases.

In operation, a predetermined electric field and/or laser pulses are applied to the quantum structure. The electric field and/or laser pulses inject electrons into the quantum structure; the electrons, then, exhibit transient negative drift velocities.

If electrons are injected at energies multiple to the optical phonon energy, then the electric field forces the electrons from the negative part of the κ-space to the lower energy subbands, thus excluding them from re-emission. Electrons from the positive part of the κ-space, however, emit optical phonons and are forced to bottom of the subband. As a result, electrons with high negative velocity dominate over those electrons with high positive velocity and cause the current to flow against the applied electric field, otherwise known as negative absolute conductance. This transient process lasts about 1 to 3 picoseconds in the field range of 100 to 500 v/cm. However, negative absolute conductivity can also be realized in a steady state if recombination of electrons is sufficiently intensive. Therefore, it may be readily appreciated by those skilled in the art that such a structure may have many uses in ultra fast, super high frequency oscillators, amplifiers and/or self regulating switches.

DETAILED DESCRIPTION OF THE INVENTION

Figure 1:
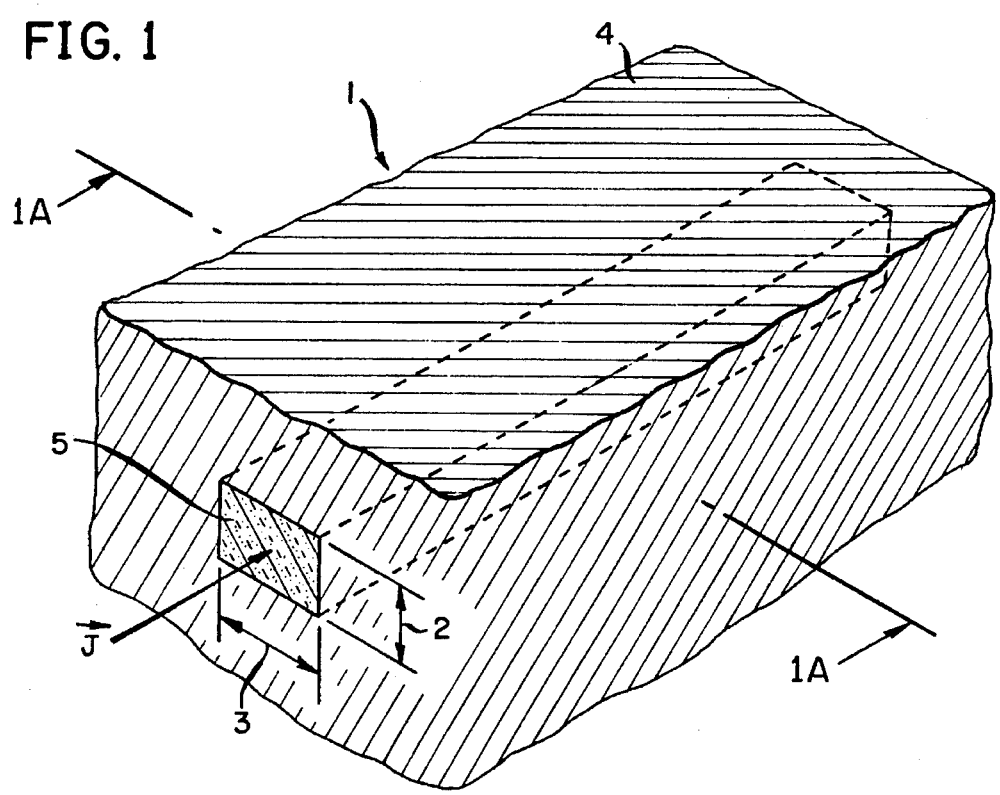
FIG. 1 is a perspective view of a rectangular quantum wire according to the present invention.
Figure 2:
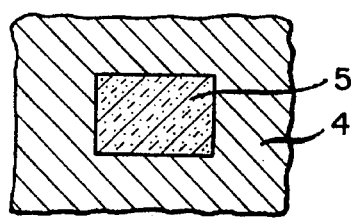
FIG. 2 is a cross-section of the rectangular quantum wire shown in FIG. 1 across line 1A—1A.

Referring now to FIG. 1, there is shown a quantum structure 1 which is comprised of a rectangular quantum wire 5 embedded in an exterior material 4. The quantum wire 5 may be fabricated from any material which would normally be used as a quantum well material in a superlattice heterostructure, such as GaAs. Likewise, exterior material 4 may be fabricated from any material which would normally be used as a quantum barrier, for example AlAs. As noted previously though, quantum wire 5 may also be free standing. The ends of quantum wire 5 should be free of any material so as to allow for clean electrical contacts to quantum wire 5. The quantum wire 5 has a predetermined height 2, and width 3. In a preferred example, quantum wire 5 has a width and a height equal to or less than 150 Å and 250 Å, respectively. Due to its size, shape and composition, this structure will have multiple energy subbands and will exhibit one dimensional intra- and intersubband scattering by confined longitudinal-optical (LO) and localized surface-optical (SO) phonons.

Figure 3:
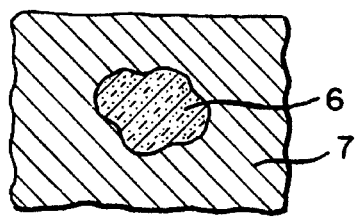
FIGS. 3 and 4 are cross-sections of alternate embodiments of quantum wires according to the present invention.
Figure 4:
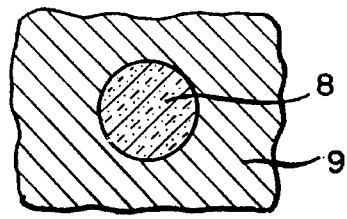

This structure may be fabricated utilizing known molecular beam epitaxy techniques or other comparable techniques utilized in fabricating like devices. These techniques are well known in the art and therefore, a skilled artisan would be able to fabricate such a device without further disclosure. FIGS. 3 and 4 simply depict alternative embodiments of the quantum wire 5 utilized in the present invention. As shown, the cross-section of the quantum wire 5 may be any configuration including a wire with a random cross-section, as shown in FIG. 3, or a wire with circular cross-section, as shown in FIG. 4.

In operation, a narrow range of injected electron energy, preferably less than 0.001 eV above the bottom of the first subband energy level or close to the optical phonon energy, is introduced into the quantum wire thereby inducing current J. The only requirements being that the electrons must be injected within a narrow energy range close to the subband bottom or optical phonon energy. The electric field must be high enough, however, to avoid severe restrictions on the injected energy and the electric field must also be low enough to prevent rapid heating of low energy electrons and deep electron penetration in the active energy region.

In principle, the injected electrons exhibit transient negative drift velocities at moderate electric fields at the beginning of electron heating. This reaction is related to the rapid absorption of LO phonons by cold injected electrons and their re-emission. This applied electric field, then, forces the electrons from the negative part of the κ-space to lower energy, thus excluding these electrons from the re-emission process. Electrons from the positive part of the κ-space, however, emit optical phonons and are forced to the bottom subband. As a result, electrons with high negative velocities dominate over those with high positive velocities and cause current J to flow against the applied electric field, otherwise known as negative absolute conductivity.

This entire transient process lasts about 1 to 3 picoseconds in the electric field range of 100 to 500 V/cm at 300 K. The length of this process will vary given different temperatures, quantum wire structures and electric fields. In fact, at low lattice temperatures negative absolute conductance occurs in a much wider range of conditions including varied injection energies, electric fields and recombination rates. Thus, in order to get a greater range of conditions it would be preferrable to keep the structure at a lower temperature, for example 70 K.

Figure 5A:
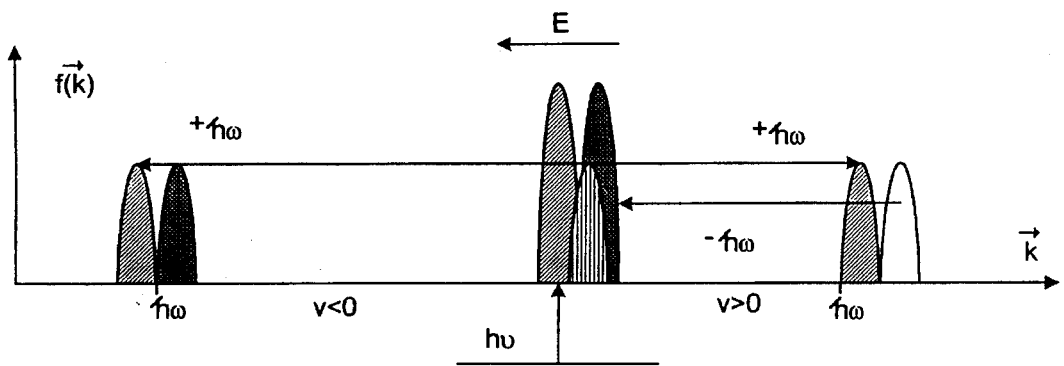
FIGS. 5a and 5b are a schematic illustration of the formation of the electron distribution according to the present invention.
Figure 5B:
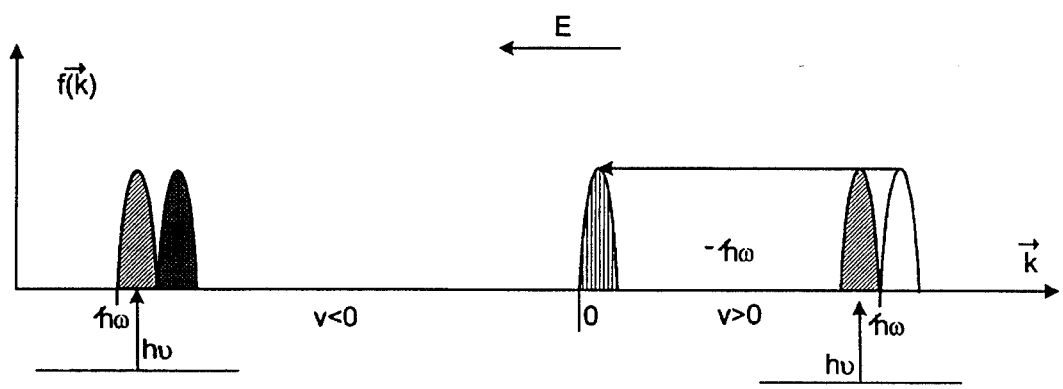
Figure 5B:

FIGS. 5a and 5b are schematic illustrations of the formation of the electron distribution function which is responsible for the negative absolute conductivity wherein FIG. 5a represents such a distribution at high lattice temperatures and the electron injection energies rise to the first subband bottom; and wherein FIG. 5b represents such a distribution at low lattice temperatures and the electron injection is set at just below the optical phonon energy. The arrows depict the electron transfer channels due to the absorption ($+\hbar\omega$) or emission ($-\hbar\omega$) of optical phonons. Area 1 represents the electron distribution just after injection; area 2 represents the electron distribution after the shift caused by the electric field and emission of optical phonons; and area 3 represents the electron peak above the optical phonon energy subsequently scattered down by the emission of optical phonons. When an electrical field is applied to the quantum wire, electrons are injected in to the first subband bottom (FIG. 5a) or just below the optical phonon energy (FIG. 5b). After this injection to the subband bottom, the electrons almost instantaneously absorb the optical phonons and enter the active region above the optical phonon energy (FIG. 5a). The electric field, then, forces the electrons out of (or away from) the active region on the negative side of the κ-axis and into the active region of the positive side of the κ-axis (FIG. 5a). Due to the fast optical phonon emission, electrons from the positive side of κ-axis scatter down to the subband bottom; these electrons stay in the negative part for a period of time until they are decelerated by the electric field or their momentum is randomized by multiple scattering events. As depicted, electrons with high negative velocity will dominate over those with positive velocity, thereby making the electron drift negative.

Given the above and as may be appreciated by those skilled in the art, a steady state negative absolute conductivity may occur if the electron heating is compensated by the recombination of the electrons or some other mechanism which keeps the electrons close to the bottom subband energy level. In other words, in order to get the effect of negative absolute conductivity in a steady state, electrons must be eliminated from the low energy regions before they are heated by the applied electric field and contribute to the positive part of the conductivity. Obviously, then, the electrons which are eliminated must be replaced by injecting new electrons. This elimination of electrons can be accomplished by either linear recombination of the electrons or by extracting the electrons through contacts. In considering linear recombination, it will be evident to those skilled in the art that the recombination rate must be such that electrons recombine primarily during the regime of transient negative conductivity; i.e., the rate of recombination must be compatible with the rate of the dominant electron scattering mechanism or the electron heating rate by the electric field whichever is higher.

Figure 6:
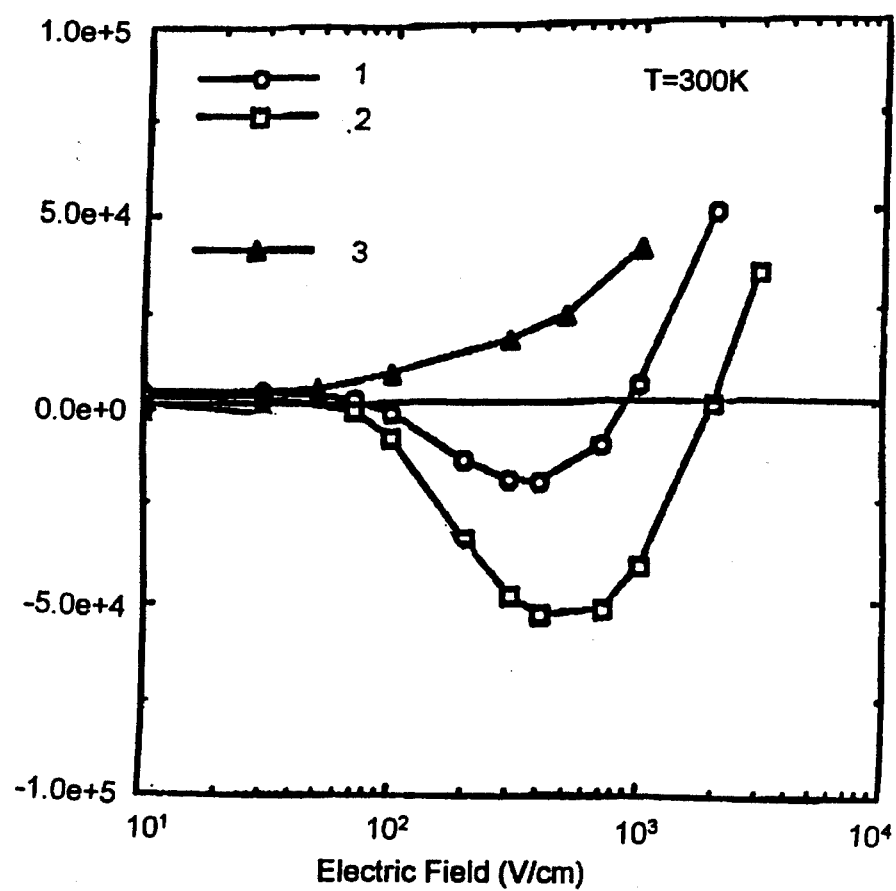
FIG. 6 is a graphical representation of the steady state electron drift velocity as a function of applied electric field.

FIG. 6 illustrates the steady-state velocity field dependencies of injected electrons under intensive recombination. Curve 1 represents the electron drift velocity as a function of applied electric field at a temperature of 300 K. for a quantum wire engineered to have 7 subbands and an electron injection into the first subband bottom. Curve 2 is for the same structure, but the electron injection occurred at the LO phonon energy. Curve 3 is the dark electron (background) velocity. For this graph, the recombination rate, $R_1$, is a step function of electron energy with a cutoff energy $\epsilon_1$ of 0.022 eV. As shown, the negative absolute conductivity appears in a certain range of electric fields and higher recombination rates. However, it should be noted that even when the velocity does not reach negative values, it decreases with the increase of the electric field, thus exhibiting negative differential conductivity. Therefore, even at these positive values the structure as described above is also useful in devices such as those described in Davies et al.

The existence of lower threshold fields for the occurrence of negative absolute conductivity is primarily caused by the injection of electrons slightly above the subband bottom, for example in FIG. 6, 0.2 meV. As a result, the electric field must be large enough to extract electrons from the negative part of the active region before the electrons emit optical phonons. As shown in FIG. 6, the effect of negative absolute conductivity is more pronounced for electron injection close to the optical phonon energy than for injection to the subband bottom. Thus, the negative absolute conductivity may be induced not only when electrons are injected close to the phonon energy, but also when electrons are injected with an energy close to a multiple of the optical phonon energy.

Figure 7A:
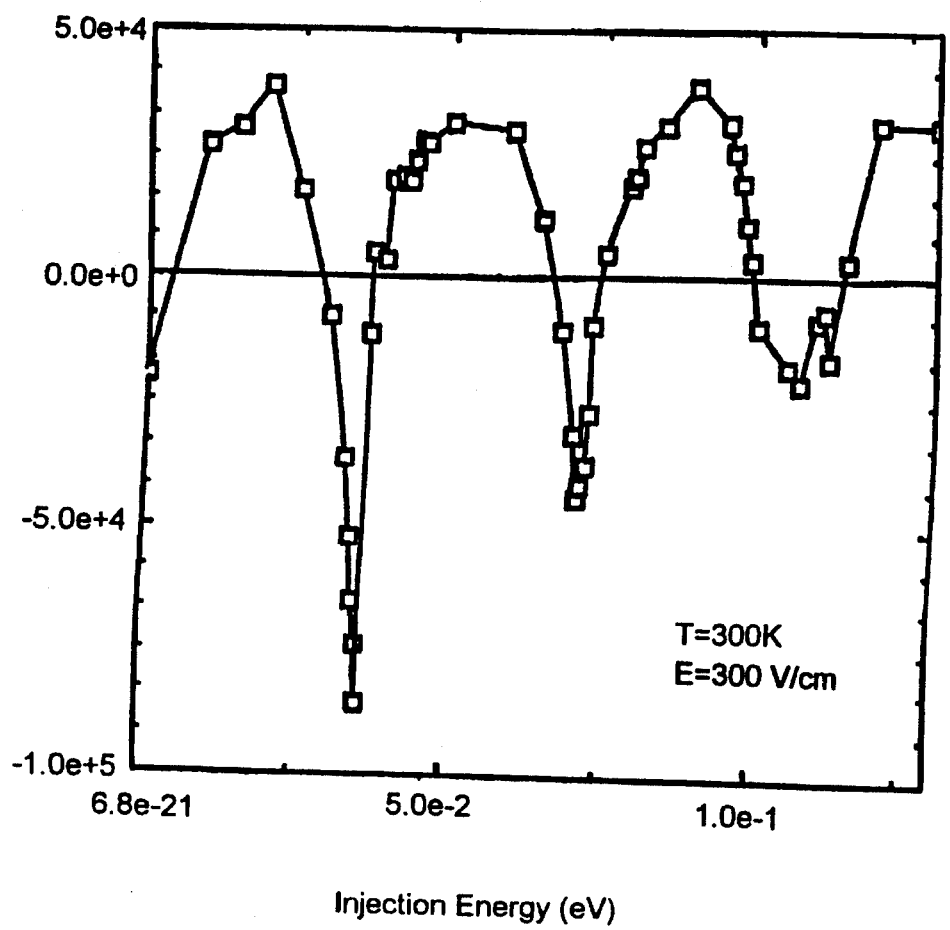
FIG. 7a and 7b are graphical representations of both the electron drift velocity (FIG. 7a) and the mean electron energy (FIG. 7b) as a function of electron injection energy.
Figure 7B:
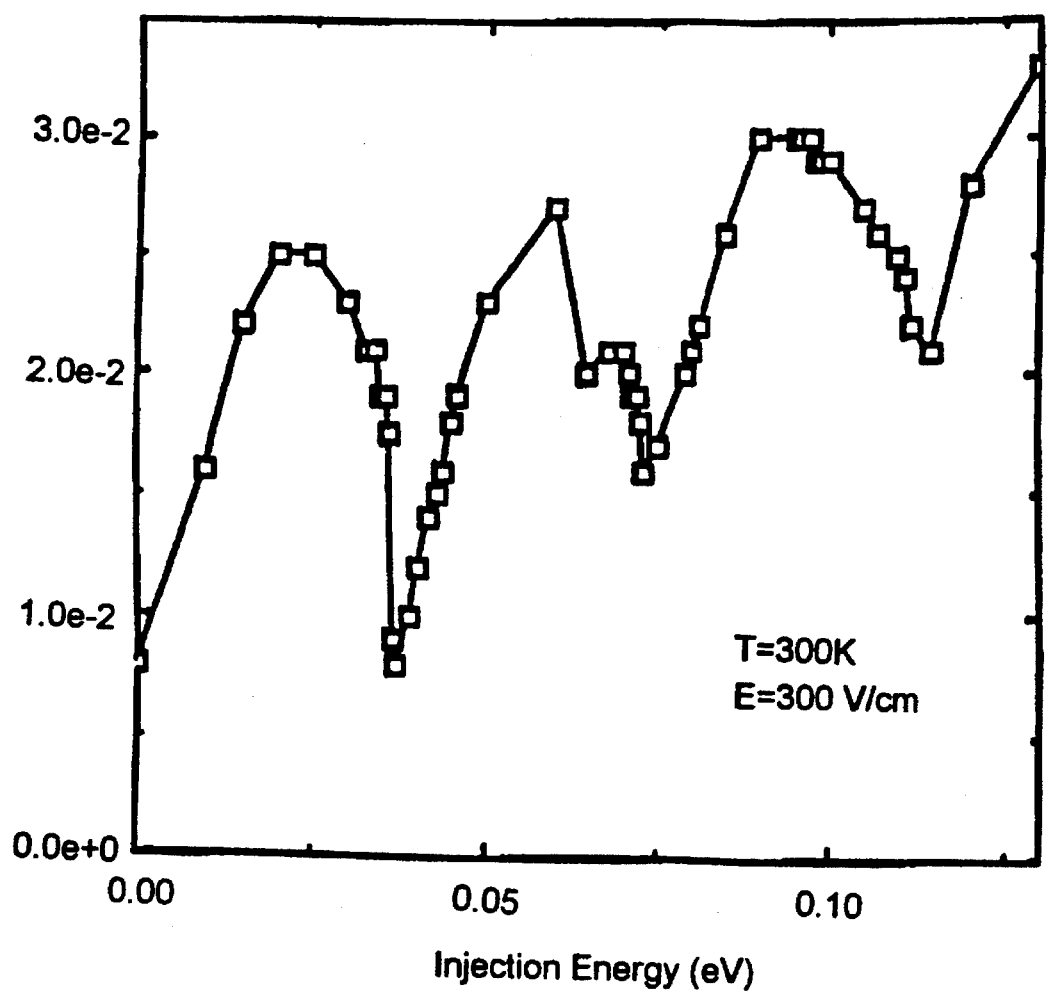

Certain injection energies at which negative absolute conductance occurs are illustrated in FIGS. 7a and 7b. In FIGS. 7a and 7b the electron drift velocity (FIG. 7a) and the mean electron energy (FIG. 7b) are depicted as a function of the injection energy. Like FIG. 6, the recombination rate was a step function with a cut-off energy of 0.022 eV and a low energy value of $R_1=2\times10^{12}$ sec$^{-1}$. As shown, the amplitudes of the oscillations of the electron velocity are larger than those found in bulk materials. The lowest minimum on this dependency graph is seen at the single energy of the LO phonon, thereby confirming the conditions for the occurrence of negative absolute conductivity. At an energy equal to three times the LO phonon energy the effect of negative absolute conductivity strongly decreases as a result of electron transfer to the second subband. The shape of the minimum is asymmetric with a steeper increase in conductivity above the multiple phonon energy. As shown in FIG. 7b, the mean electron energy is also an oscillatory function of the injection energy; i.e. relative cooling of the electron system takes place.

As a result, the frequency of negative absolute conductivity can be controlled by controlling the injection of electrons, the applied voltage and/or the recombination rate. Thus, those skilled in the art will readily recognize the myriad of applications for a structure exhibiting the above described qualities. For example, such a structure may be utilized as an oscillator by merely engineering the size of the quantum wire to experience negative absolute conductivity at a predetermined frequency. Moreover, one skilled in the art would also readily appreciate the use of such a structure as a self regulating switch.

Therefore, while the principles of the present invention have been described in connection with a specific structure, it is to be understood that this description is made only by way of example and not as a limitation to the scope of the invention, because those skilled in the art will readily recognize that the example structure described herein may be further engineered by altering its size, shape and/or composition in order to achieve greater or lesser magnitudes of negative absolute conductivity.

What is claimed is:

1. A low dimensional quantum structure comprising:

an exterior material;

a quantum well semiconductor material embedded in the exterior material, the quantum well semiconductor material being of a predetermined length, width and height so as to exhibit low dimensional quantum qualities and have multiple subbands of electron energy levels; and means to apply an electron injection energy which is a multiple of the LO phonon energy present in the quantum well semiconductor material, whereby a negative absolute conductivity is induced in the quantum well semiconductor material.

2. The quantum structure of claim 1 wherein the quantum well semiconductor material is gallium arsenide and the exterior material is aluminum arsenide.

3. The quantum structure of claim 1 wherein the structure is at a temperature below 70 K.

4. The quantum structure of claim 1 wherein the structure further comprises means to compensate for electron heating.

5. The quantum structure of claim 4 wherein the means to compensate for electron heating includes a means to linearly recombine the electrons injected at the lower subband energy levels.

6. A low dimensional quantum structure comprising:

a exterior material;

a quantum well semiconductor material embedded in the exterior material, the quantum well semiconductor material being of a predetermined length, width and height so as to exhibit low dimensional quantum qualities and have multiple subbands of electron energy levels; and means to apply an electron injection energy which is approximately equal to the energy of the bottom subband energy level present in the quantum well semiconductor material, whereby a negative absolute conductivity is induced in the quantum well semiconductor material.

7. The quantum structure of claim 6 wherein the structure is at a temperature below 70 K.

8. The quantum structure of claim 6 wherein the structure further comprises means to compensate for electron heating.

9. The quantum structure of claim 8 wherein the means to compensate for electron heating includes a means to linearly recombine the electrons injected at the lower subband energy levels.

10. A method of inducing negative absolute conductivity comprising the steps of:

forming a structure of predetermined size and shape from a quantum well semiconductor material such that multiple subbands of electron energy levels are present in the quantum well semiconductor material and such that the quantum well semiconductor material exhibits low quantum dimensional qualities; and applying an electron injection energy to the quantum well semiconductor material, the electron injection energy being equal to a multiple of the longitudinal-optical phonon energy present in the quantum well semiconductor material.

11. The method of claim 10 further comprising the step of cooling the quantum well semiconductor material to a temperature below 70 K.

12. The method of claim 10 further comprising the step of linearly recombining the electrons at the lower subband energy levels in order to compensate for electron heating at lower energy subband energy levels.

13. A method of inducing negative absolute conductivity comprising the steps of:

forming a structure of predetermined size and shape from a quantum well semiconductor material such that multiple subbands of electron energy levels are present in the quantum well semiconductor material and such that the quantum well semiconductor material exhibits low quantum dimensional qualities; and applying an electron injection energy to the quantum well semiconductor material, the electron injection energy being approximately equal to bottom subband energy level present in the quantum well semiconductor material.

14. The method of claim 13 further comprising the step of cooling the quantum well semiconductor material to a temperature below 70 K.

15. The method of claim 13 further comprising the step of linearly recombining the electrons at the lower subband energy levels in order to compensate for electron heating at lower energy subband energy levels.

* * * * *